United States Patent [19]
Hossain et al.

[11] Patent Number: 6,156,650
[45] Date of Patent: Dec. 5, 2000

[54] METHOD OF RELEASING GAS TRAPPED DURING DEPOSITION

[75] Inventors: Tim Z. Hossain; William S. Brennan; Berta Valdez; Renee S. Prusik; Amiya R. Ghatak-Roy, all of Austin, Tex.

[73] Assignee: Advanced Micro Devices, Inc., Sunnyvale, Calif.

[21] Appl. No.: 09/191,576

[22] Filed: Nov. 13, 1998

[51] Int. Cl.⁷ .................................................. H01L 21/44
[52] U.S. Cl. .......................................... 438/660; 438/795
[58] Field of Search ..................................... 438/660, 795

[56] References Cited

U.S. PATENT DOCUMENTS 5,723,367   3/1998   Wada et al. .

OTHER PUBLICATIONS

Chang et al., *ULSI Technology*, McGraw Hill, pp. 382, 457 (1996).
Wolf, *Silicon Processing for the VLSI Era*, Lattice Press, vol. 2: Process Integration, pp. 188–217 (1990).
Wolf, *Silicon Processing for the VLSI Era*, Lattice Press, vol. 2: Process Integration, pp. 240–260 (1990).
Wolf, *Silicon Processing for the VLSI Era*, Lattice Press, vol. 2: Process Integration, pp. 334–337 (1990).

*Primary Examiner*—Charles Bowers
*Assistant Examiner*—Evan Pert

[57] ABSTRACT

A method of making a semiconductor device to reduce or prevent defects caused by the ejection of deposited material. The method includes a first layer of material deposited over a substrate in the presence of a gaseous ambient. A portion of the gaseous ambient is trapped by the first layer. This entrapped portion could cause defects during subsequent elevated temperature processing as the gas attempts to escape from the first layer. To prevent or reduce this problem, after depositing the first layer and before depositing a second layer over the first layer, the first layer is heated to remove at least a portion of the gaseous ambient trapped in the layer. For best results, the first layer is heated to a temperature at least as high as the highest temperature of later processing steps and at a pressure of no more than 1 torr. This method is particularly useful for layers formed by physical vapor deposition.

28 Claims, 4 Drawing Sheets

METHOD OF RELEASING GAS TRAPPED DURING DEPOSITION

FIELD OF THE INVENTION

The present invention is directed to semiconductor devices and methods of making semiconductor devices. In particular, the present invention is directed to reducing defects in semiconductor devices with layers formed by deposition techniques, such as physical vapor deposition, that are followed by subsequent higher temperature processing.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. Such silicon-based semiconductor devices often include metal-oxide-semiconductor (MOS) transistors, such as p-channel MOS (PMOS), n-channel MOS (NMOS) and complimentary MOS (CMOS) transistors, bipolar transistors, BiCMOS transistors, etc.

Each of these semiconductor devices generally include a semiconductor substrate on which a number of active devices are formed. The particular structure of a given active device can vary between device types. For example, in MOS transistors, an active device generally includes source and drain regions and a gate electrode which modulates current between the source and drain regions. In bipolar transistors, an active device generally includes a base, a collector, and an emitter.

A typical semiconductor substrate includes a large number of transistors which are interconnected using one or more layers of metal. FIG. 1 illustrates an exemplary multilevel-interconnect structure for MOS technologies. The interconnect structure illustrated in FIG. 1 includes two metal layers 101 and 102. The first metal layer 101 generally interconnects active portions of the transistors, such as the gate electrode 105 and the source/drain region 104. Each subsequent metal layer, such as second metal layer 102, typically interconnects regions of the previously formed metal layer. Dielectric layers 106 and 107 are provided between conductive structures, such as the metal layers 101 and 102, the gate electrode 105, and the source/drain region 104 in order to isolate these structures from one another. Openings or vias 108 and 109 in the dielectric layers 106 and 107 are used to interconnect these structures as desired. A more detailed description of metal layers and the fabrication thereof may be found in S. Wolf, *Silicon Processing for the VLSI Era,* Vol. 2: Processing Integration, pp. 188–217, 240–260 and 334–337.

Defects in a semiconductor wafer or defects formed during processing of the wafer may result in manufacturing losses. One particular defect occurs, for example, during the formation of the second metal layer when a portion of the underlying dielectric layer is ejected from the substrate and lands on the wafer. This type of defect can be referred to as a "pancake" defect. There is a need for methods of reducing or eliminating this type of defect.

SUMMARY OF THE INVENTION

Generally, the present invention relates to methods of forming a semiconductor device having a layer deposited over the substrate using, for example, physical vapor deposition, followed by subsequent higher temperature processing. In one particular embodiment, a method of making a semiconductor device includes depositing a first layer of material over a substrate in the presence of a gaseous ambient. A portion of the gaseous ambient is trapped by the first layer. This entrapped gaseous ambient could cause defects during subsequent elevated temperature processing as the gas attempts to escape from the first layer. To prevent or reduce this problem, after depositing the first layer and before forming a second layer over the first layer, the first layer is heated to remove at least a portion of the gaseous ambient trapped in the layer. For best results, the first layer is heated to a temperature at least as high as the highest temperature of later processing steps and at a pressure of no more than 1 torr. This method is particularly useful for layers that are deposited by physical vapor deposition.

The above summary of the present invention is not intended to describe each illustrated embodiment or every implementation of the present invention. The FIGS. and the detailed description which follow more particularly exemplify these embodiments.

BRIEF DESCRIPTION OF THE DRAWINGS

The invention may be more completely understood in consideration of the flowing detailed description of various embodiments of the invention in connection with the accompanying drawings, in which.

Figure 1:
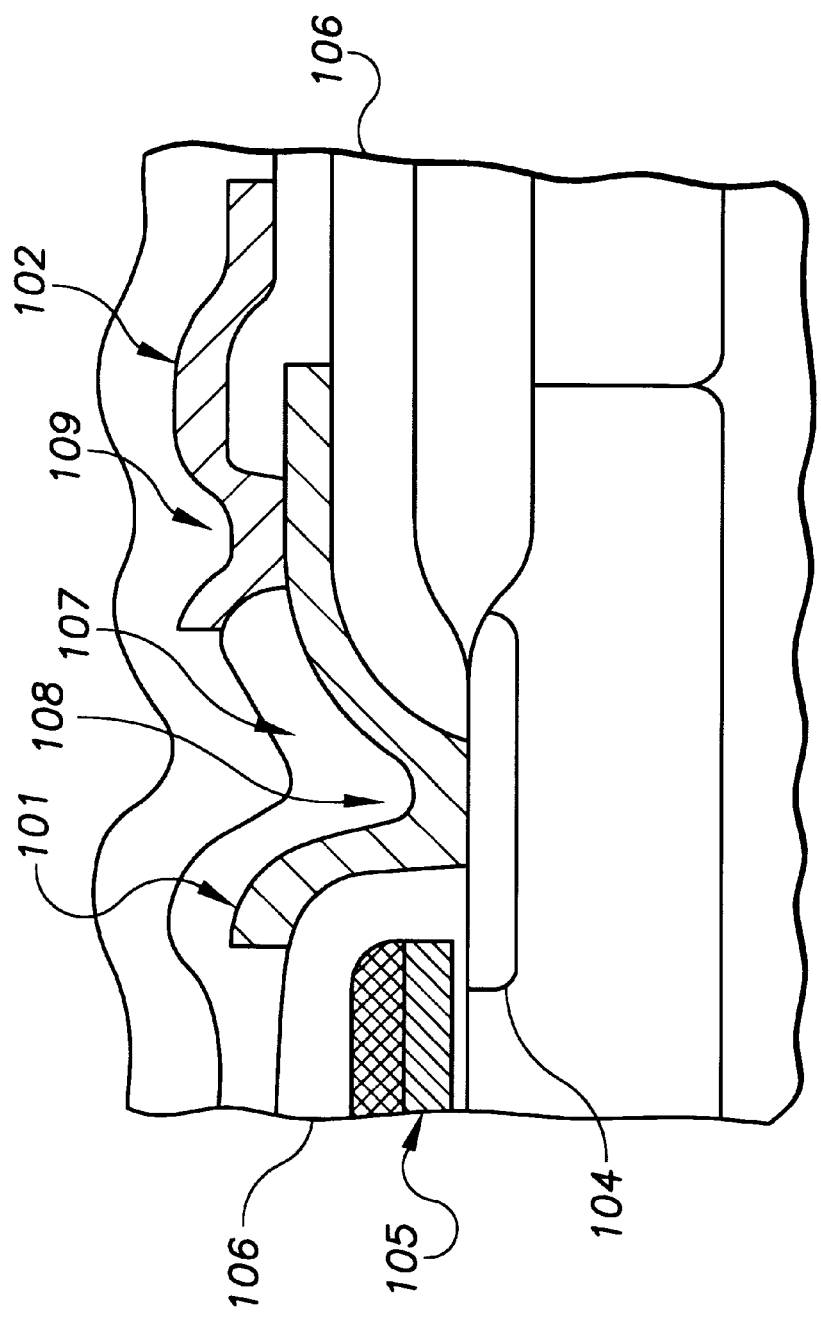
FIG. 1 illustrates a cross-section of a conventional multi-layer interconnect structure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to semiconductor devices and methods of making these devices. The invention is particularly suited for making semiconductor devices with metals layers formed by, for example, physical vapor deposition, without or with a reduced incidence of "pancake" defects. While the present invention is not so limited, an appreciation of various aspects of the invention will be gained through a discussion of the various application examples operating in such environments.

A "pancake" defect occurs when a portion of a layer, such as a dielectric layer, is ejected from its position on the substrate. The detrimental results can include, for example, openings in the layer where the material was ejected, the deposition of the ejected material on another portion of the substrate, and/or the blocking of via holes by the ejected material.

It has been determined that the "pancake" defects arise, at least in part, due to the trapping of a gaseous ambient in a first metal layer formed (e.g., by physical vapor deposition) in the gaseous ambient and at temperatures lower than subsequent processing steps. The "pancake" defect and methods for eliminating or reducing the incidence of "pancake" defects are described with reference to the formation of multi-layer interconnects and in particular the formation of a second metal layer at a higher temperature after the physical vapor deposition of a first metal layer. It will be understood that "pancake" defects can also occur in other situations during processing of semiconductor devices, particularly, when processing steps are performed at higher temperatures subsequent to the deposition of a layer (e.g., a metal layer) at a lower temperature and in the presence of a gaseous ambient. The methods described herein for reducing or eliminating these defects can be adapted for these situations.

Figure 2A:
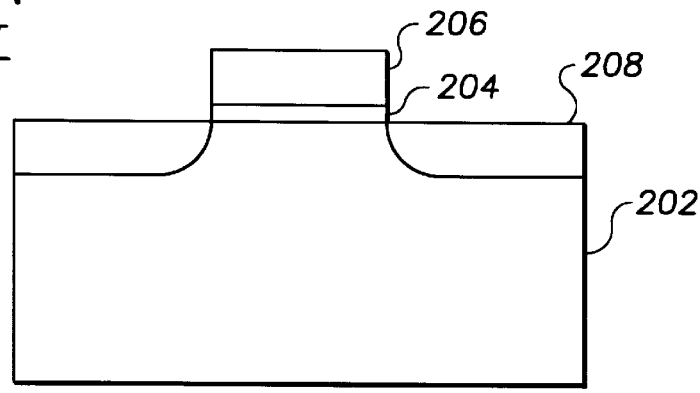
FIGS. 2A–2F illustrate an exemplary process for forming a multi-layer interconnect structure.

FIGS. 2A–2F illustrate one example of a process for forming multi-layer interconnects using metal layers in a MOS device. It will be understood that similar processes can be used to form multi-layer interconnects in other semiconductor devices, including bipolar and biCMOS devices. A MOS device is formed on a substrate 202 with a gate electrode 206, a gate insulating layer 204, and source/drain regions 208, as shown in FIG. 2A. Methods for forming this MOS device, as well as other MOS device structures are known in the art and can be used.

Figure 2B:
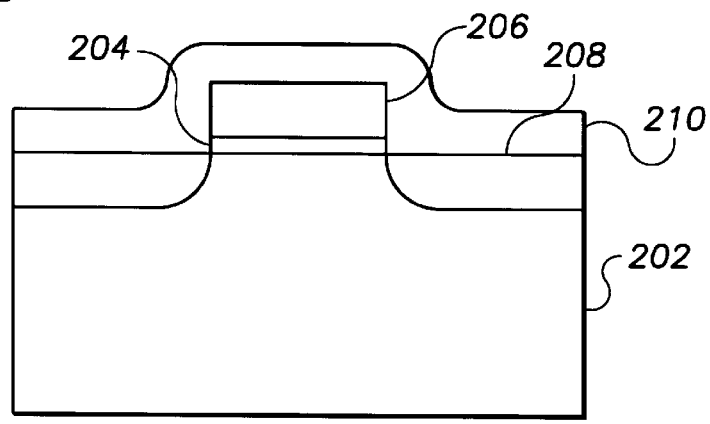
Figure 2C:
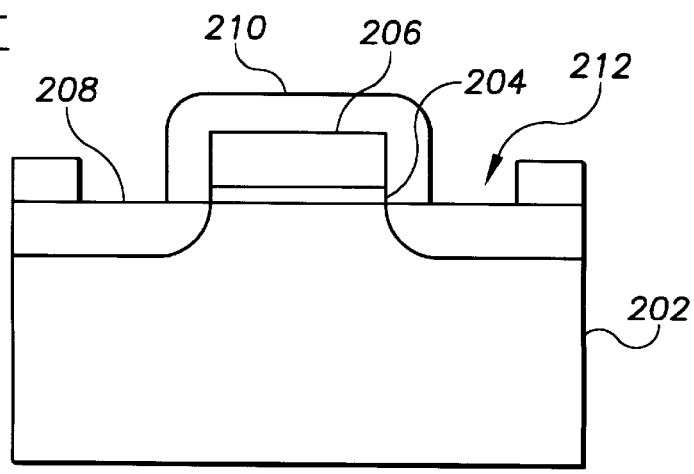

To prepare a multi-layer interconnect device, according to the process illustrated in FIGS. 2A–2F, a first dielectric layer 210 is formed over the gate electrode 206 and the substrate 202, as shown in FIG. 2B. The first dielectric layer 210 can be formed using a variety of non-conducting materials, including, for example, silicon dioxide, silicon nitride, silicon oxynitride, nitrided silicon dioxide ($SiO_xN_y$), and non-conducting metal oxides. The first dielectric layer 210 can be formed by a variety of methods including, for example, chemical vapor deposition, physical vapor deposition, and spin-on glass formation. The first dielectric layer 210 is used to electrically isolate the gate electrode and source/drain regions except at designated contact points. One or more first vias 212 are then formed in the first dielectric layer 210, as shown in FIG. 2C. The first vias 212 can be formed by, for example, known photolithographic techniques.

Figure 2D:
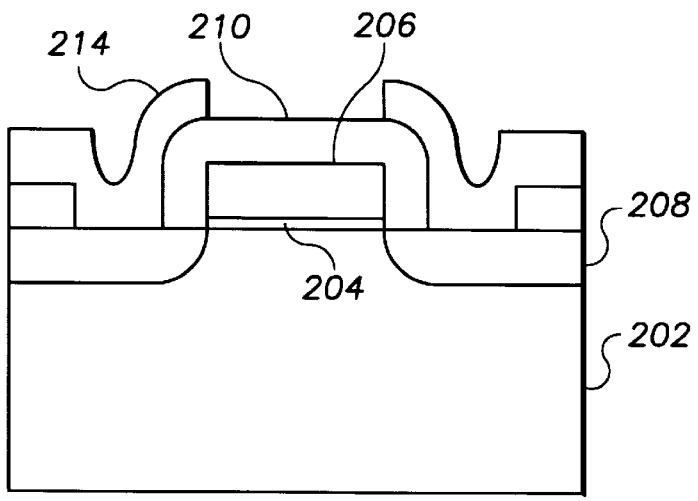

A first metal layer 214 is formed over the first dielectric layer 210 and in the first vias 212 and then portions of the first metal layer 214 are removed to leave one or more conductive lines, as shown in FIG. 2D. The first metal layer 214 is formed by physical vapor deposition (e.g., sputtering) using a metallic material, such as aluminum, titanium, tungsten, or titanium nitride. The portions of the first metal layer 214 can be removed using, for example, known etching techniques.

The physical vapor deposition of the first metal layer 214 often includes bombarding a target containing the metallic material by a plasma formed by a low pressure (e.g., 1 to 100 millitorr) gaseous ambient in an electric field. The bombardment of the target generates a vapor of the metallic material that can then be deposited as the first metal layer 214. A variety of gaseous ambients can be used, including, for example, noble gases, such as helium, neon, argon, krypton, or xenon, as well as other gases, such as oxygen or nitrogen. One example of a commonly used deposition that results in "pancake" defects is the physical vapor deposition of titanium and/or titanium nitride in an argon ambient.

Figure 2E:
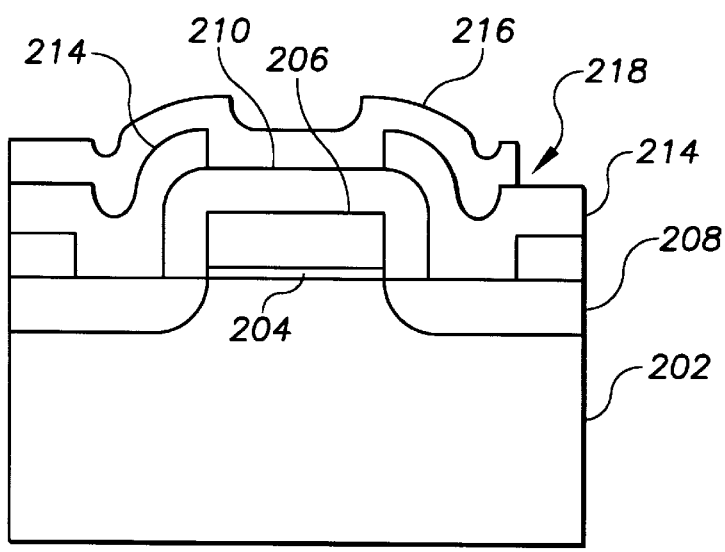

A second dielectric layer 216 is formed over the first metal layer 214 and then second vias 218 are formed in the second dielectric layer 216, as shown in FIG. 2E. The second dielectric layer 216 can be formed of the same material as the first dielectric layer 210 and the second vias 218 can be formed by the same methods as the first vias 212.

Figure 2F:
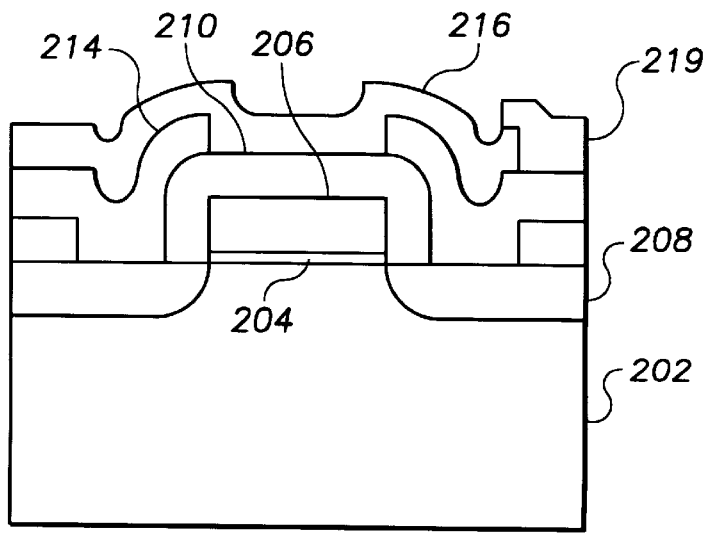

A second metal layer 219 is formed over the second dielectric layer 216 and within the second vias 218 and then portions of the second metal layer 219 are removed to form conductive lines, as shown in FIG. 2F. The second metal layer 219 is typically formed by chemical vapor deposition of a metallic material, such as, for example, aluminum, titanium, tungsten, titanium nitride, or aluminum with 1 wt. % copper and 1 wt. % silicon. The chemical vapor deposition typically occurs at temperatures that are higher than those used for physical vapor deposition. For example, the chemical vapor deposition of a metallic material, such as titanium nitride, may occur at a substrate temperature of at least 400° C. and often 450 to 500° C. It is often during the formation of this second metal layer, or in the subsequent formation of other layers requiring higher temperature processing, that "pancake" defects occur.

When preparing semiconductor devices, one or more individual semiconductor wafers are processed, each semiconductor wafer being used to form many individual devices simultaneously. These semiconductor wafers are, for example, 8 inches (about 20 cm) or more in diameter. A peripheral region around the edge of the semiconductor wafer is often not formed into devices because this region is often grasped or held during one or more processing steps or when transferring between processing machines. It is believed that the origin of at least some of the "pancake" defects is at the edge of the semiconductor wafer.

Figure 3A:
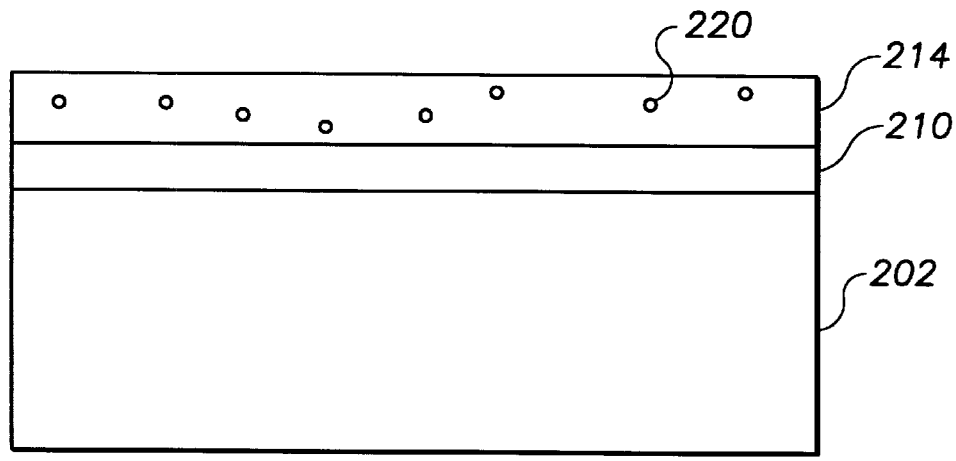
FIGS. 3A and 3B illustrate a mechanism by which defects may be formed in semiconductor devices.
Figure 3B:
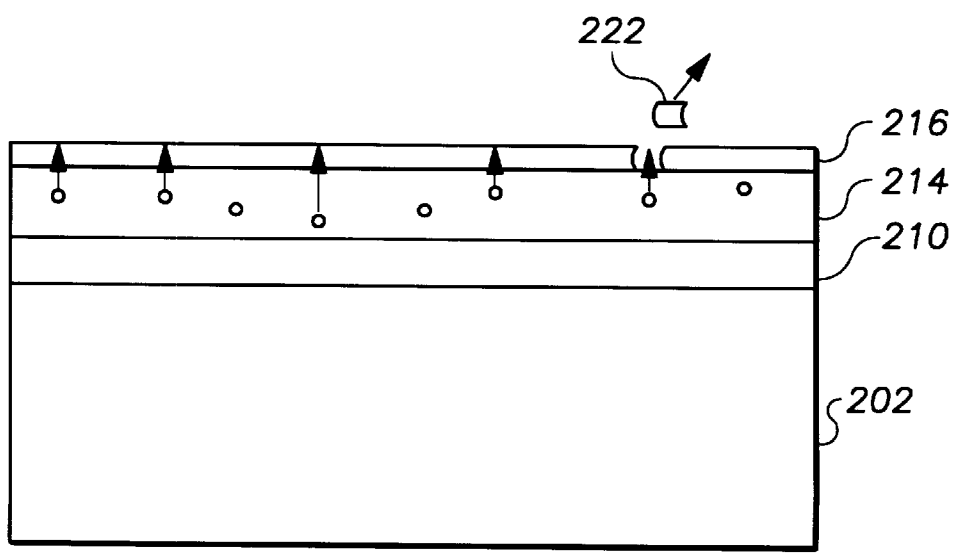

FIGS. 3A and 3B illustrate the same structure as shown in FIGS. 2A through 2F, but at the edge of the semiconductor wafer where there are no MOS devices. During the physical vapor deposition process of the first metal layer 214 over the first dielectric layer 210 and substrate 202, a portion of the gaseous ambient 220 is entrapped in the first metal layer 214, as illustrated in FIG. 3A. This entrapment of a portion of the gaseous ambient occurs over the entire wafer. The entrapment of gas by solid materials is known. For example, titanium and titanium nitride entrap gas and are used as getters in some vacuum pump devices. The entrapment of the gaseous ambient typically occurs throughout the wafer.

The second dielectric layer 216 is then formed over the first metal layer 214 and the entrapped gaseous ambient 220, as illustrated in FIG. 3B. As the second metal layer (not shown) is being formed by chemical vapor deposition, the semiconductor wafer is heated. Upon heating, at least a portion of the entrapped gaseous ambient 220 is released. Typically, with higher temperature, more of the entrapped gaseous ambient 220 is released.

Within the regions of the semiconductor wafer that are used for devices (see FIGS. 2A–2F), it is thought that the gaseous ambient may diffuse through the first metal layer 214 to the second vias 218 and escape. However, along the edge of the semiconductor wafer (see FIGS. 3A and 3B), the gaseous ambient can not diffuse to a via, as there are typically few or none in this region of the wafer, and so the gaseous ambient pushes against the typically denser second dielectric layer 216. This results in portions 222 of the second dielectric layer 216 being ejected from the surface of the semiconductor wafer by the pressure of the gaseous ambient 220 attempting to escape from the first metal layer 214. These ejected portions 222 can then, at least in some instances, be deposited on the wafer, thereby causing "pancake" defects in the second metal layer and/or second vias.

It is found that the incidence of "pancake" defects can be reduced or eliminated by removing the trapped gaseous ambient. This can be accomplished by de-gassing the wafer after the physical vapor deposition of the first metal layer and before the formation of the second dielectric layer. The de-gassing process can occur in the same chamber as the physical vapor deposition of the first metal layer. Alternatively, a different apparatus can be used, such as, for example, a chemical vapor deposition chamber.

This de-gassing process includes heating the wafer under low pressure. The best results are often achieved if the wafer is heated to at least the highest temperature that will be used in subsequent processing steps. For example, if the second metal layer is formed by chemical vapor deposition of, for example, TiN at about, for example, 400° C., then the wafer should be heated to at least 400 to 500° C. (e.g., 450° C. or more) during the de-gassing process.

In addition to heating, the de-gassing process should occur under low pressure so that the gaseous ambient can be removed from the environment of the semiconductor wafer. If the gaseous ambient is not removed then when the wafer cools, a portion of the gaseous ambient may be trapped again in the metal layer. Typically, the pressure during the de-gassing process is no more than about 1 torr, often no more than about 10 millitorr, and, in some instances, no more than about 1 millitorr.

The de-gassing process should not be confused with a conventional pre-physical vapor deposition process in which the semiconductor wafer is heated at low pressures (e.g., 10 torr or less) immediately before forming a metal layer (e.g., the first and/or second metal layers). The purpose of heating the semiconductor wafer before the formation of the first and/or second metal layers is to remove water vapor that might contaminate or react with the semiconductor wafer or the first and/or second metal layer.

EXAMPLE

A control set of wafers were coated by physical vapor deposition in an argon ambient with thin titanium films of varying thicknesses, ranging from 100 to 600 Angstroms. Each wafer was then coated with a silicon dioxide film having a thickness in the range of 1000 to 8000 Angstroms. The control set of wafers was heated to 450° C. Bubbles and blisters were found in the oxide film, indicative of the formation of "pancake" defects.

A second set of wafers were coated by physical vapor deposition in an argon ambient with thin titanium films of varying thicknesses, ranging from 100 to 600 Angstroms. Each wafer was then heated to about 400° C. at a pressure of about 10 millitorr to removed entrapped argon. Each wafer was then coated with a silicon dioxide film having a thickness in the range of 1000 to 8000 Angstroms. The second set of wafers was heated to 450° C. The absence or reduction in the number of blisters and bubbles in the oxide film showed that heating in low pressure prior to forming another film can reduce the production of "pancake" defects.

As noted above, the present invention is applicable to a number of different devices and systems where a layer is formed at relatively low temperatures , e.g., by physical vapor deposition, followed by one or more processing steps at higher temperatures (e.g., the formation of a second metal layer by chemical vapor deposition). Accordingly, the present invention should not be considered limited to the particular examples described above, but rather should be understood to cover all aspects of the invention as fairly set out in the attached claims. Various modifications, equivalent processes, as well as numerous communication devices to which the present invention may be applicable will be readily apparent to those of skill in the art upon review of the present specification. The claims are intended to cover such modifications and devices.

We claim:

1. A method of making a semiconductor device, comprising:
   depositing a first layer of a material over a substrate in the presence of a gaseous ambient, wherein the first layer traps a portion of the gaseous ambient; and
   heating the first layer, after depositing the first layer and before forming a second layer over the first layer, at a pressure of no more than 1 torr to remove at least a portion of the gaseous ambient trapped in the first layer.

2. The method of claim 1, wherein heating the first layer comprises heating the first layer, after depositing the first layer and before forming a second layer over the first layer, at a pressure of no more than 10 millitorr to remove at least a portion of the gaseous ambient trapped in the first layer.

3. The method of claim 1, wherein depositing the first layer comprises depositing the first layer over the substrate by physical vapor deposition in the presence of a gaseous ambient.

4. The method of claim 3, wherein depositing the first layer by physical vapor deposition comprises sputtering a layer of a metallic material over a substrate.

5. The method of claim 1, wherein the substrate comprises a MOS device.

6. The method of claim 1, wherein the first layer comprises a metal layer.

7. The method of claim 6, wherein the metal layer comprises titanium or titanium nitride.

8. The method of claim 6, wherein the metal layer includes a metal from the group consisting of tungsten, aluminum and aluminum with 1 wt. % copper and 1 wt. % silicon.

9. The method of claim 1, further comprising forming a second layer over the first layer subsequent to heating the first layer.

10. The method of claim 9, wherein the second layer is formed from a dielectric material.

11. The method of claim 1, wherein heating the first layer comprises heating the first layer to a temperature of at least 400° C. to remove at least a portion of the gaseous ambient trapped in the first layer.

12. The method of claim 1, wherein the gaseous ambient comprises a noble gas.

13. The method of claim 1, wherein the gaseous ambient comprises argon.

14. The method of claim 1, wherein the substrate comprises a wafer of semiconductor material.

15. The method of claim 1, further comprising heating the substrate at a pressure of 10 torr or less prior to depositing the first layer.

16. The method of claim 1, wherein heating the first layer comprises heating the first layer, after depositing the first layer and before forming a second layer over the first layer, at a pressure of no more than 1 millitorr to remove at least a portion of the gaseous ambient trapped in the first layer.

17. The method of claim 1, wherein the substrate includes a device from the group consisting of bipolar and biCMOS devices.

18. The method of claim 1, wherein the step of heating the first layer includes removing the gaseous ambient from the environment of the substrate so as to prevent a portion of the gaseous ambient from being trapped again in the first layer.

19. A method of making a semiconductor device, comprising:

depositing a titanium-containing layer on a substrate by physical vapor deposition in the presence of a noble gas ambient, wherein the titanium-containing layer traps a portion of the noble gas ambient; and heating the titanium-containing layer and the substrate, after depositing the titanium-containing layer and prior to depositing another layer over the titanium-containing layer, to a temperature at least as high as a highest temperature used in subsequent processing steps and in a vacuum of no more than 1 torr to remove at least a portion of the trapped noble gas ambient.

20. The method of claim 19, wherein depositing a titanium-containing layer comprises sputtering a titanium-containing material on a substrate to form a titanium-containing layer.

21. The method of claim 19, wherein heating the titanium-containing layer comprises heating the titanium-containing layer and the substrate to a temperature at least as high as a highest temperature used in subsequent processing steps and in a vacuum of no more than 1 millitorr to remove at least a portion of the trapped noble gas ambient.

22. The method of claim 19, wherein heating the titanium-containing layer comprises heating the titanium-containing layer and the substrate to at least 400° C. in a vacuum of no more than 1 torr to remove at least a portion of the trapped noble gas ambient.

23. The method of claim 22, wherein the titanium-containing layer is heated in a vacuum of no more than 10 millitorr to remove at least a portion of the trapped noble gas ambient.

24. The method of claim 19, wherein the noble gas ambient comprises argon.

25. The method of claim 19, wherein the titanium-containing layer comprises titanium or titanium nitride.

26. The method of claim 19, further comprising forming a dielectric layer over the titanium-containing layer subsequent to heating the titanium-containing layer.

27. The method of claim 19, wherein the step of heating the titanium-containing layer includes removing the noble gas ambient from the environment of the substrate so as to prevent a portion of the noble gas ambient from being trapped again.

28. The method of claim 19, wherein heating the titanium-containing layer comprises heating the titanium-containing layer and the substrate to a temperature at least as high as a highest temperature used in subsequent processing steps and in a vacuum of no more than 10 millitorr to remove at least a portion of the trapped noble gas ambient.

* * * * *

UNITED STATES PATENT AND TRADEMARK OFFICE
CERTIFICATE OF CORRECTION

PATENT NO.   : 6,156,650
DATED        : December 5, 2000
INVENTOR(S)  : Hossain et al.

It is certified that error appears in the above-identified patent and that said Letters Patent is hereby corrected as shown below:

Column 2,
Line 52, "devices with metals layers" should read -- devices with metal layers --.

Column 5,
Line 49, "to removed entrapped" should read -- to remove entrapped --.

Signed and Sealed this

Twenty-eighth Day of January, 2003

JAMES E. ROGAN
*Director of the United States Patent and Trademark Office*